(12) United States Patent
Zhang et al.

(10) Patent No.: US 7,494,856 B2
(45) Date of Patent: Feb. 24, 2009

(54) SEMICONDUCTOR FABRICATION PROCESS USING ETCH STOP LAYER TO OPTIMIZE FORMATION OF SOURCE/DRAIN STRESSOR

(75) Inventors: Da Zhang, Austin, TX (US); Ted R. White, Austin, TX (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 391 days.

(21) Appl. No.: 11/393,340

(22) Filed: Mar. 30, 2006

(65) Prior Publication Data

US 2007/0238250 A1  Oct. 11, 2007

(51) Int. Cl.
*H01L 21/336* (2006.01)

(52) U.S. Cl. .................. 438/197; 257/213; 257/E21.19; 257/E21.394

(58) Field of Classification Search .................. 438/300, 438/589, 197, 275, 585; 257/213, E21.19, 257/E21.394, E21.615
See application file for complete search history.

(56) References Cited

U.S. PATENT DOCUMENTS

| 6,831,292 | B2 | 12/2004 | Currie et al. |
| 6,881,632 | B2 | 4/2005 | Fitzgerald et al. |
| 7,018,901 | B1 | 3/2006 | Thean et al. |
| 7,018,910 | B2 | 3/2006 | Ghyselen et al. |
| 7,045,407 | B2 * | 5/2006 | Keating et al. ............... 438/198 |
| 7,348,259 | B2 * | 3/2008 | Cheng et al. ................. 438/458 |
| 2006/0024898 | A1 | 2/2006 | Chidambaram et al. |
| 2006/0030093 | A1 * | 2/2006 | Zhang et al. ................. 438/197 |

OTHER PUBLICATIONS

International Search Report and Written Opinion.

* cited by examiner

*Primary Examiner*—Quoc D Hoang
(74) *Attorney, Agent, or Firm*—Kim-Marie Vo

(57) ABSTRACT

A semiconductor fabrication process includes forming an etch stop layer (ESL) overlying a buried oxide (BOX) layer and an active semiconductor layer overlying the ESL. A gate electrode is formed overlying the active semiconductor layer. Source/drain regions of the active semiconductor layer are etched to expose the ESL. Source/drain stressors are formed on the ESL where the source/drain stressors strain the transistor channel. Forming the ESL may include epitaxially growing a silicon germanium ESL having a thickness of approximately 30 nm or less. Preferably a ratio of the active semiconductor layer etch rate to the ESL etch rate exceeds 10:1. A wet etch using a solution of $NH_4OH:H_2O$ heated to a temperature of approximately 75° C. may be used to etch the source/drain regions. The ESL may be silicon germanium having a first percentage of germanium. The source/drain stressors may be silicon germanium having a second percentage of germanium for P-type transistors, and they may be silicon carbon for N-type transistors.

20 Claims, 3 Drawing Sheets

SEMICONDUCTOR FABRICATION PROCESS USING ETCH STOP LAYER TO OPTIMIZE FORMATION OF SOURCE/DRAIN STRESSOR

FIELD OF THE INVENTION

The invention is in the field of semiconductor fabrication and, more particularly, semiconductor fabrication processes that use strained transistor channels.

RELATED ART

Semiconductor fabrication processes that employ strained transistors are well known. Typically, a transistor channel is subjected to tensile or compressive stress along one or more axes to improve carrier mobility in the channel and thereby enhance transistor performance. One technique for subjecting the channel to stress includes the use of a source/drain stressor. A source/drain (S/D) stressor refers to the use of a source/drain material having a different lattice constant than the lattice constant of the transistor channel material, which is usually silicon. A S/D stressor is typically realized by etching device S/D regions followed by epitaxial growth of a strained film in the etched cavities. Forming source/drain stressors of this type can be problematic because of difficulty in controlling the source/drain etch process. The S/D etch rate typically varies across the wafer, and it changes for areas with different device feature densities. As a result, the etch process induces unwanted S/D recessing depth variation. It would be desirable to implement a process that addressed the processing variability associated with conventional techniques for creating source/drain stressors.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor fabrication process incorporates an etch stop layer (ESL) between the active layer and a BOX layer of a silicon on insulator (SOI) wafer. The ESL facilitates the formation of a source/drain stressor. Specifically, the ESL is of a material for which an etch process with a high selectivity between the active layer and the ESL is available. In one embodiment, the active layer is a silicon active layer, the ESL is silicon germanium and the source/drain stressor is a semiconductor compound, such as silicon germanium for PMOS transistors or silicon carbon for NMOS transistors, having a lattice constant that differs from the lattice constant of silicon. By incorporating the ESL and a highly selective source/drain etch process, unwanted variability associated with conventional methods of forming source/drain stressor is reduced or eliminated. One aspect of the semiconductor fabrication processes described herein is the formation of a SOI wafer having an ESL between the active semiconductor layer and the BOX layer.

Referring now to FIG. 1 through FIG. 6, selected stages in the fabrication of such a wafer according to one embodiment are illustrated. The depicted sequence includes processing a first wafer (the donor wafer) to form a stack including a dielectric layer, the ESL, and the active semiconductor layer. This processing may include cleaving the substrate of the donor wafer to form the active semiconductor layer. A dielectric layer is deposited on the semiconductor substrate of a second wafer (the handle wafer). The dielectric layer of the donor wafer is then bonded to the dielectric layer of the handle wafer. The bonded dielectric layers form the BOX layer.

Figure 1:
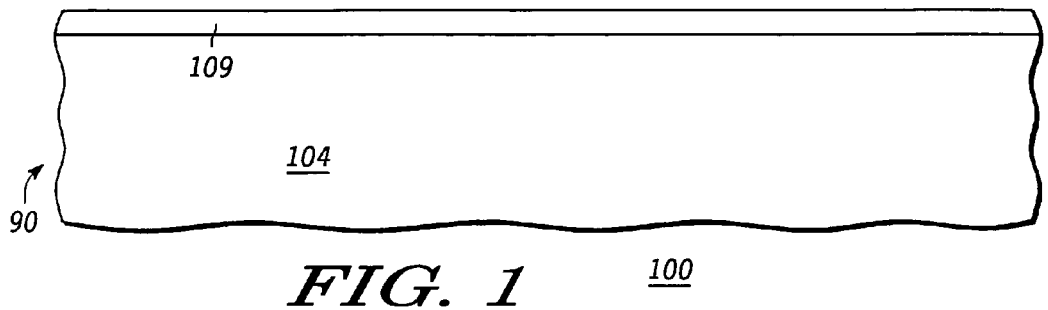
FIG. 1 is a partial cross sectional view of a semiconductor wafer at an early stage in the fabrication of an integrated circuit according to an embodiment of the invention emphasizing the formation of an etch stop layer on a semiconductor substrate of a donor wafer.

Turning first to FIG. 1, a partial cross sectional view of an integrated circuit 100 at an intermediate stage in a fabrication process is depicted. At the depicted stage, an ESL 109 has been formed overlying a semiconductor bulk 104 of a first wafer, referred to herein as donor wafer 90. ESL 109 is preferably a relatively thin film having a thickness in the range of approximately 5 to 30 nm and is still more preferably, having a thickness that is less than or equal to approximately 10 nm. The composition of ESL 109 is chosen primarily for its etch characteristics. More specifically, ESL 109 is preferably of a material that is etch selective with respect to the material of semiconductor bulk 104. For purposes of this disclosure, a material is etch selective with respect to another material if an etch process can be found that is highly selective to one of the material. In the preferred embodiment, the selectivity between ESL 109 and semiconductor bulk 104 is preferably in excess of 10:1. A second consideration for ESL 109 is the effect ESL 109 may have on transistor performance.

In some embodiments, semiconductor bulk 104 is crystalline silicon and ESL layer is a semiconductor compound that is pseudomorphic with respect to semiconductor bulk 104. In these embodiments, a silicon germanium compound ($Si_{(1-X)}Ge_X$) is a suitable material for ESL 109 because silicon germanium is highly etch selective with respect to silicon and because the presence of a thin film of silicon germanium underlying a transistor channel may have beneficial effects on transistor characteristics. The germanium content (X) of ESL 109 in these embodiments is preferably in the range of approximately 5 to 15% and, in some embodiments, is a function of the germanium content in a subsequently formed silicon germanium source/drain stressor as described below with respect to FIG. 9.

Figure 2:
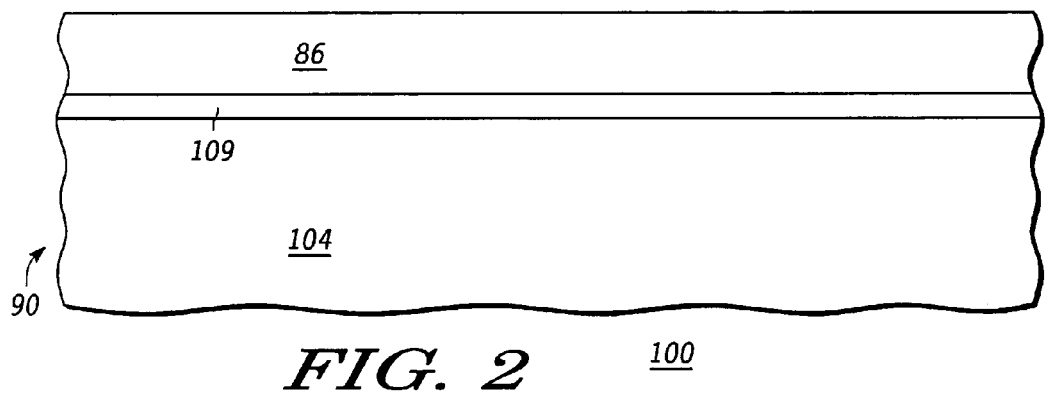
FIG. 2 depicts processing subsequent to FIG. 1 in which a dielectric layer is formed on the etch stop layer.

Referring now to FIG. 2, a dielectric layer 86 is deposited or otherwise formed overlying ESL 109. Dielectric layer 86 will serve as at least a portion of the BOX layer in the finished integrated circuit. A thickness of dielectric layer 86 is preferably in the range of approximately 20 to 200 nm. Dielectric layer 86 may be a CVD silicon oxide layer such as a silicon oxide layer conventionally formed using a TEOS (tetraethylorthosilicate) source.

Figure 3:
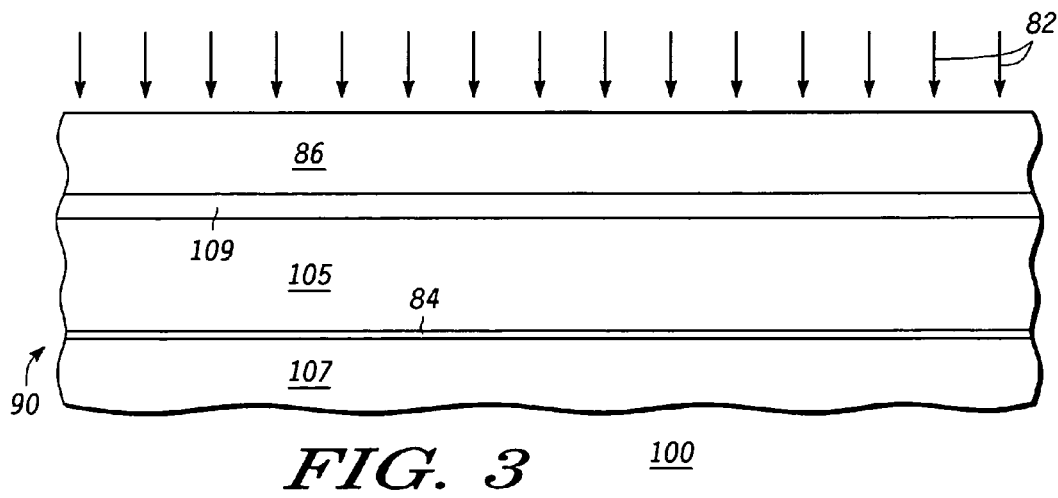
FIG. 3 depicts processing subsequent to FIG. 2 in which a damage layer is formed in the donor wafer substrate.

Turning now to FIG. 3, ion implantation 82 is performed to form an implant damage layer 84 within semiconductor bulk 104. Implant damage layer 84 divides semiconductor bulk 104 into a first region 105 that is adjacent to ESL 109 and a second region 107 that is distal from ESL 109. In one embodiment, implant damage layer 84 is created by implanting hydrogen into semiconductor bulk 104 using an implant dose of $5\times10^{16}$ cm$^{-2}$ or more.

Figure 4:
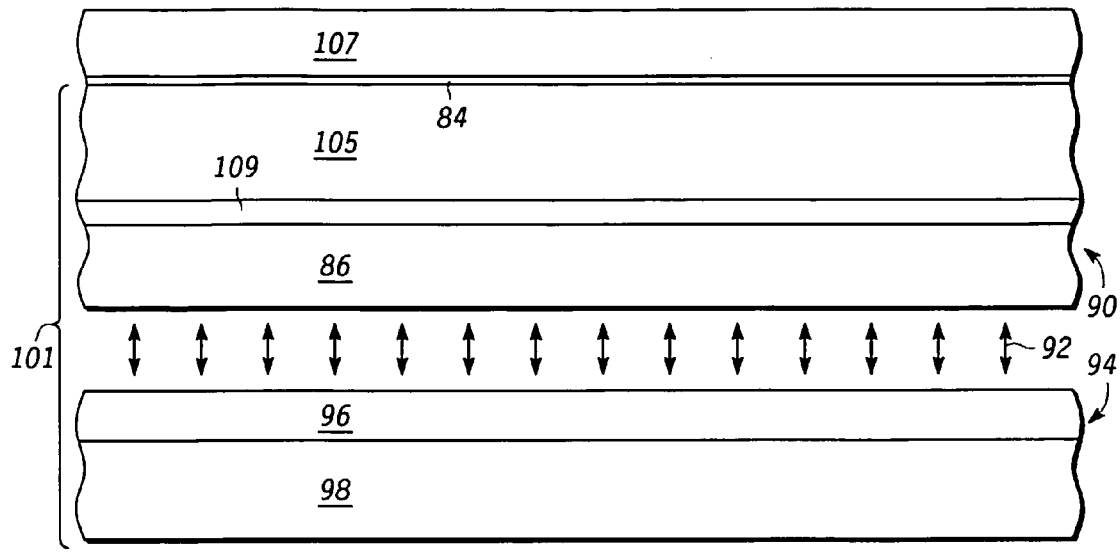
FIG. 4 depicts processing subsequent to FIG. 3 in which the dielectric layer of the donor wafer is bonded to a dielectric layer on a handle wafer to form an integrated circuit wafer.

Turning now to FIG. 4, a handle wafer 94 is bonded, as indicated by reference numeral 92, to donor wafer 90 to form integrated circuit wafer 101. The depicted implementation of handle wafer 94 includes a dielectric layer 96 overlying a bulk portion 98. The dielectric layer 96 of handle wafer 94 is preferably of the same or a similar dielectric material as dielectric layer 86 of donor wafer 90. Bulk portion 98 of handle wafer 94 is preferably a semiconductor material such as crystalline silicon.

Figure 5:
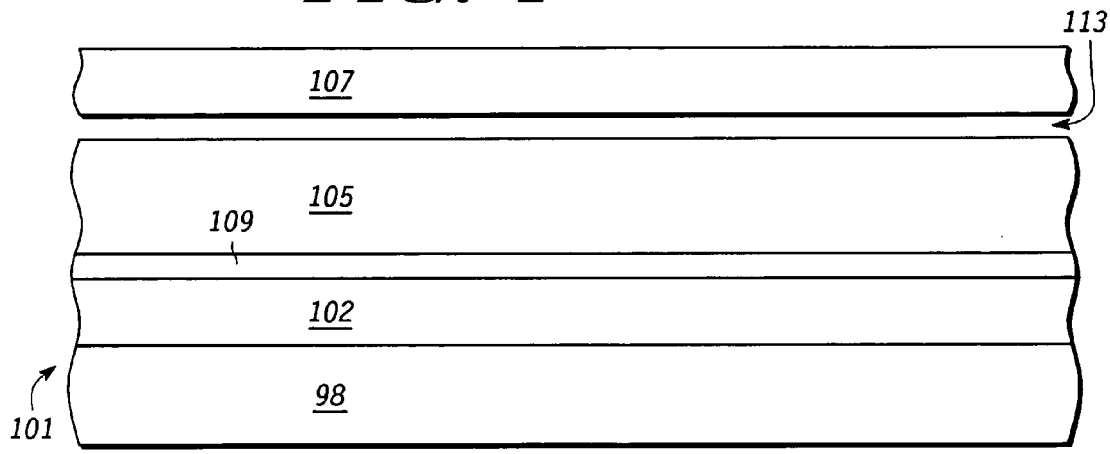
FIG. 5 depicts processing subsequent to FIG. 4 in which the donor wafer is cleaved at the damage layer of FIG. 3 to expose a new upper surface.

Implant damage layer 84 facilitates a cleaving process 113, illustrated in FIG. 5, in which the second region 107 of semiconductor bulk 104 "below" implant damage layer 84 is severed from the remainder of donor wafer 90 and discarded. In one embodiment, ion implantation 82 uses an energy and implant species that damage layer 84 is a relatively narrow band displaced from ESL 109 by approximately 50 nm. Suitable implant species include hydrogen. After cleaving process 113 and preparation of the new surface of first region 105 for device processing, first region 105 of donor wafer 90 will serve as an active layer of integrated circuit 100 in which transistors and possibly other devices are formed. Accordingly, first region 105 is sometimes referred to herein as active layer 105.

Figure 6:
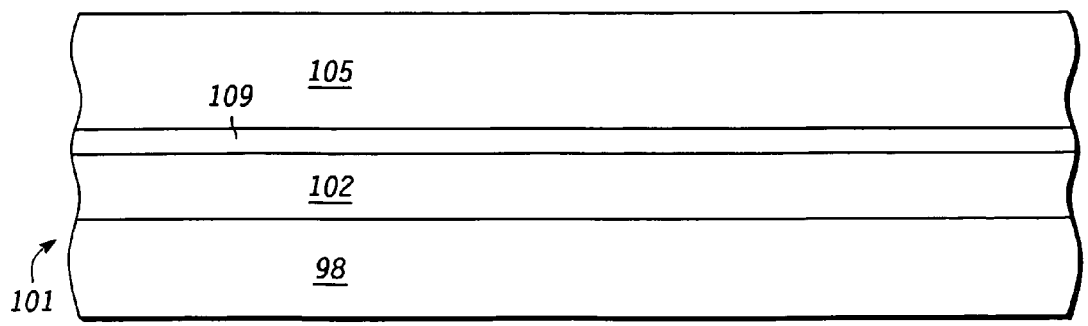
FIG. 6 depicts processing subsequent to FIG. 5 in which the new upper surface of FIG. 5 is prepared for device processing.

In the depicted embodiment, dielectric layer 86 of donor wafer 90 is bonded to dielectric layer 96 of handle wafer 94 to form a BOX layer 102 in integrated circuit wafer 101 using thermal bonding or another known bonding technique. In this embodiment, integrated circuit wafer 101, as depicted in FIG. 6, may be described as an SOI wafer with an ESL 109 located between semiconductor active layer 105 and BOX layer 102. The presence of ESL 109 facilitates stressor formation processing (described in greater detail below) by enabling a robust etch of active layer 105 without etching to BOX layer 102.

Figure 7:
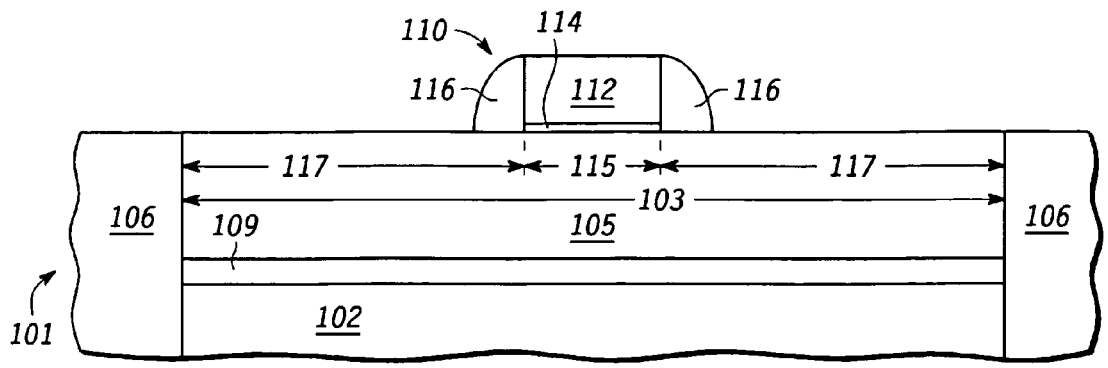
FIG. 7 depicts processing subsequent to FIG. 6 in which a gate structure is formed on the active semiconductor layer over a transistor channel of the active semiconductor layer.

Turning now to FIG. 7, subsequent processing of integrated circuit wafer 101 according to one embodiment has been performed to form isolation structures 106 and a gate structure 110. Isolation structures 106 define lateral boundaries of an active region or transistor region 103 in active layer 105. Gate electrode 110 includes a conductive gate electrode 112 overlying a gate dielectric 114 and spacer structures (spacers) 116 on sidewalls of gate electrode 112. The lateral boundaries of gate electrode 112 approximately define lateral boundaries of a transistor channel 115 and source/drain regions 117 disposed on either side of transistor channel 115 in active layer 105. Gate electrode 112 is an electrically conductive structure of doped polysilicon, a metal or metal silicide material, or a combination thereof. Gate dielectric 114 is preferably a thermally formed silicon dioxide or a high K dielectric such as hafnium oxide (HfO$_2$). Spacers 116 are preferably silicon nitride, silicon oxide, or a combination thereof. A source/drain extension type implantation may be conducted prior to the spacer formation.

Figure 8:
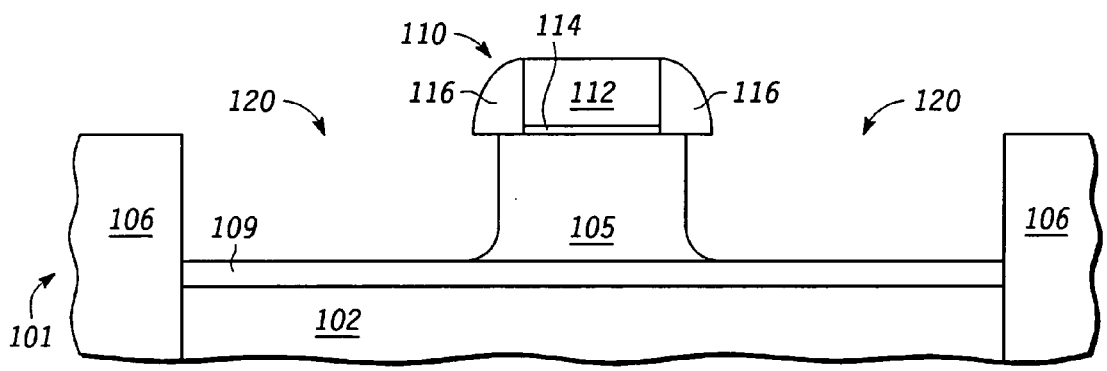
FIG. 8 depicts processing subsequent to FIG. 7 in which source/drain voids are etched into source/drain regions of the wafer displaced on either side of the transistor channel.

In FIG. 8 the source/drain regions 117 of active layer 105 have been substantially removed to create source/drain voids 120 that expose an upper surface of ESL 109. In one embodiment, removal of source/drain regions 117 includes an etch process that is highly selective to ESL 109. For purposes of this disclosure, a highly selective etch refers to an etch process having a relative etch rate in excess of 10:1 between the two materials of primary concern (i.e., the layer being etched and the ESL). In an embodiment where source/drain regions 117 are silicon and ESL 109 is silicon germanium, for example, the etch process that removes source/drain regions 117 may include a wet etch component using an NH$_4$OH:H$_2$O solution heated to approximately 75 C. See, e.g., Feng Wang et al., *Highly Selective Chemical Etching of Si vs. SiGe*", J. Electrochemical Society, vol. 144, no. 3, pp L37-L39, (1997) (reporting a Si:SiGe selectivity exceeding 80:1).

Figure 9:
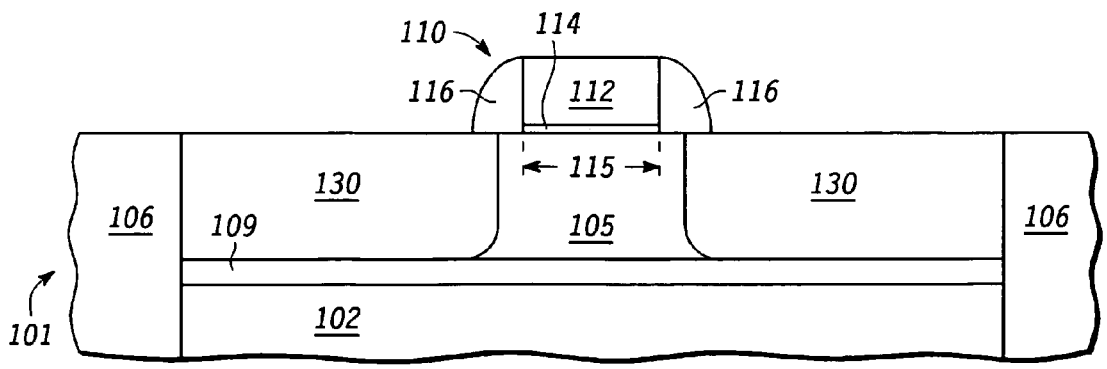
FIG. 9 depicts processing subsequent to FIG. 8 in which the source/drain voids are filled with source/drain stressors.

Turning now to FIG. 9, the source/drain voids 120 of FIG. 8 are refilled with source/drain structures referred to herein as source/drain stressors 130. In one embodiment, source/drain stressors 130 have a lattice constant that differs from the lattice constant of the original active layer 105 that occupies the majority of transistor channel 115. Source/drain stressors 130 induce strain to the transistor channel 115 and, preferably, improve the mobility of the relevant carrier in the transistor channel. In a PMOS transistor, for example, a source/drain stressor 130 that creates compressive stress in transistor channel 115 improves the hole mobility thereby improving the performance of PMOS transistors. In NMOS transistors, source/drain stressors 130 preferably create tensile stress in transistor channel 115 improve the electron mobility and NMOS transistor performance. A suitable source/drain stressor material for PMOS transistors is silicon germanium while a source source/drain stressor material for NMOS transistors is silicon carbon. In one embodiment, source/drain stressor 130 is a silicon germanium compound ($Si_{(1-Y)}Ge_Y$) and ESL 109 is a silicon germanium compound ($Si_{(1-X)}Ge_X$) where X and Y differ. Preferably, Y is greater than X in this embodiment to enhance the compressive effects of source/drain stressor 130. The stressor film may be doped for proper conductivity type. The doping process can be done in situ during stressor film epitaxial growth by providing proper reactant sources, or it can be done after stressor film growth with implantation. An anneal process can be performed after the doping process.

In the foregoing specification, the invention has been described with reference to specific embodiments. However, one of ordinary skill in the art appreciates that various modifications and changes can be made without departing from the scope of the present invention as set forth in the claims below. For example, although the illustrated embodiment include bonding a donor wafer having a Si/SiGe/Oxide stack to a handle wafer having an Oxide/Si stack to form the integrated circuit wafer, other implementations may create the SiGe etch stop layer by starting with an ultra thin body (UTB) SiGe-on-insulator (SGOI) wafer and growing the Si active layer using epitaxy. Still other processes may start with a conventional SGOI wafer having a SiGe layer on top of the isolation BOX, thin down the SiGe top layer to form the ESL and then grow a Si active layer using epitaxy. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process comprising:
    providing an integrated circuit wafer including an active semiconductor layer overlying an etch stop layer (ESL) overlying a buried oxide (BOX) layer, wherein said ESL is in contact with the BOX layer;
    forming a gate structure, including a gate electrode overlying a gate dielectric, overlying a transistor channel of said active semiconductor layer;
    etching source/drain regions deposed on either side of the transistor channel to form source/drain voids, wherein said source/drain voids expose said ESL; and
    filling said source/drain voids with source/drain stressors overlying said ESL, wherein a lattice constant of said source/drain stressors differs from a lattice constant of the active semiconductor layer.

2. The semiconductor fabrication process of claim 1, wherein said forming of said integrated circuit wafer includes:
    forming said etch stop layer on a semiconductor substrate of a donor wafer;
    depositing a dielectric layer on said etch stop layer;
    implanting hydrogen into said donor wafer to form a region of damage in said semiconductor substrate of said donor wafer;
    depositing a dielectric layer on a semiconductor substrate of a handle wafer; and
    bonding the dielectric layer of the donor wafer to the dielectric layer of the handle wafer, and
    cleaving said donor wafer along said region of damage.

3. The semiconductor fabrication process of claim 1, wherein forming said active semiconductor layer comprises silicon and wherein said ESL comprises a semiconductor compound.

4. The method in claim 3, wherein said semiconductor compound is pseudomorphic with respect to said active semiconductor layer.

5. The semiconductor fabrication process of claim 4, wherein said semiconductor compound comprises a silicon germanium compound $Si_{(1-x)}Ge_x$ wherein a percentage of germanium in the silicon germanium compound (X) is in a range of approximately 5 to 15%.

6. The semiconductor fabrication process of claim 5, wherein said source/drain stressor comprises a silicon germanium compound $Si_{(1-Y)}Ge_Y$ wherein a percentage of germanium (Y) in the silicon germanium compound is higher than X.

7. The semiconductor fabrication process of claim 4, wherein said source/drain stressor comprises a silicon carbon compound.

8. The semiconductor fabrication process of claim 1, wherein forming said integrated circuit wafer includes forming said active semiconductor layer and said ESL wherein an etch selectivity between said active semiconductor layer and said ESL equals or exceeds 10:1.

9. The semiconductor fabrication process of claim 8, wherein said active semiconductor layer is silicon and wherein said ESL is silicon germanium.

10. The semiconductor fabrication process of claim 9, wherein etching said source/drain regions includes dipping said integrated circuit wafer in a solution of $NH_4OH:H_2O$ heated to a temperature of approximately 75° C.

11. The semiconductor fabrication process of claim 1, wherein providing the integrated circuit comprises growing said active semiconductor layer over said ESL using epitaxy and wherein filling said source/drain voids comprises growing said source/drain voids using epitaxy.

12. A semiconductor fabrication process, comprising:
    providing a silicon germanium etch stop layer (ESL) over and in contact with a buried oxide (BOX) layer of a wafer;
    forming an active semiconductor layer overlying the silicon germanium ESL;
    forming a gate electrode overlying a transistor channel of the active semiconductor layer;
    etching source/drain regions of the active semiconductor layer displaced on either side of the transistor channel to expose the ESL using an etch process; and
    forming source/drain stressors on the ESL and displaced on either side of the transistor channel, wherein the source/drain stressors strain the transistor channel.

13. The semiconductor fabrication process of claim 12, wherein forming the layer of silicon germanium ESL comprises growing the ESL epitaxially.

14. The semiconductor fabrication process of claim 12, wherein said silicon germanium ESL is pseudomorphic with said active semiconductor layer.

15. The semiconductor fabrication process of claim 12, wherein a ratio of an etch rate of the active semiconductor layer to an etch rate of the ESL equals or exceeds 10:1.

16. The semiconductor fabrication process of claim 12, wherein etching said source/regions comprises wet etching said wafer in a solution of $NH_4OH:H_2O$ heated to a temperature of approximately 75° C.

17. The semiconductor fabrication process of claim 12, wherein the ESL comprises silicon germanium having a first percentage of germanium and wherein the source/drain stressors are comprised of silicon germanium having a second percentage of germanium, wherein the second percentage differs from the first.

18. The semiconductor fabrication process of claim 17, wherein the second percentage is greater than the first percentage.

19. The semiconductor fabrication process of claim 12, wherein the source/drain stressors are comprised of silicon carbon.

20. A semiconductor fabrication method, comprising:
    forming a silicon germanium etch stop layer (ESL) overlying a buried oxide (BOX) layer, wherein the ESL is in contact with the BOX layer;
    forming source/drain stressors of silicon germanium or silicon carbon overlying the ESL and laterally disposed on either side of a silicon transistor channel; and
    forming a gate electrode overlying the transistor channel.

* * * * *